US011513176B2

(12) United States Patent
Cheng et al.

(10) Patent No.: US 11,513,176 B2
(45) Date of Patent: Nov. 29, 2022

(54) COMPACT HYBRID ORTHOGONAL SIGNAL GENERATOR FOR MRI FRONT-END

(71) Applicant: Siemens Healthcare GmbH, Erlangen (DE)

(72) Inventors: Hong Cheng, Shenzhen (CN); Zhi Bin Li, Shenzhen (CN); Wen Ming Li, Shenzhen (CN); JianMin Wang, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/375,529

(22) Filed: Jul. 14, 2021

(65) Prior Publication Data

US 2022/0018917 A1   Jan. 20, 2022

(30) Foreign Application Priority Data

Jul. 15, 2020   (CN) .......................... 202010679859.5

(51) Int. Cl.
*G01R 33/34*   (2006.01)
*G01R 33/36*   (2006.01)
*H01F 38/14*   (2006.01)

(52) U.S. Cl.
CPC ... *G01R 33/34007* (2013.01); *G01R 33/3628* (2013.01); *H01F 38/14* (2013.01)

(58) Field of Classification Search
CPC .......... G01R 33/34007; G01R 33/3628; H01F 38/14
See application file for complete search history.

(56) References Cited

U.S. PATENT DOCUMENTS

| 5,483,163 | A | 1/1996 | Wen et al. |
| 7,235,973 | B2 | 6/2007 | Chmielewski et al. |
| 10,541,459 | B2 | 1/2020 | Grede et al. |
| 2004/0075435 | A1 | 4/2004 | Weyers et al. |
| 2005/0122185 | A1* | 6/2005 | Podell ..................... H01P 5/187 333/112 |

(Continued)

FOREIGN PATENT DOCUMENTS

KR   20150045530 A   4/2015

*Primary Examiner* — G.M. A Hyder
(74) *Attorney, Agent, or Firm* — Banner & Witcoff Ltd.

(57) ABSTRACT

The disclosure relates to a hybrid orthogonal signal generator, a coil transmission front-end device, an RF coil system, and an MRI system. The hybrid orthogonal signal generator has an input end for receiving an RF signal, generates a hybrid orthogonal excitation signal on the basis of the RF signal, and provides the hybrid orthogonal excitation signal by means of an output end of the hybrid orthogonal signal generator, and comprises: a first conductor, arranged in a plane and being arc-shaped; and a second conductor having mutual inductance with the first conductor, the second conductor being connected between the input end and output end, wherein the first conductor and second conductor are parallel and arranged as mirror images of each other. The hybrid orthogonal signal generator has a compact size and is suitable for providing hybrid orthogonal excitation signals for an MRI system with a low field strength.

13 Claims, 8 Drawing Sheets

(56) References Cited

U.S. PATENT DOCUMENTS

| | | | |
|---|---|---|---|
| 2009/0189712 A1* | 7/2009 | Jiang | H01P 5/185 333/116 |
| 2010/0308934 A1* | 12/2010 | Taracila | G01R 33/365 324/322 |
| 2011/0032065 A1* | 2/2011 | Raczkowski | H01L 23/5227 336/200 |
| 2016/0056521 A1* | 2/2016 | Meharry | H01P 5/185 333/116 |
| 2016/0131725 A1 | 5/2016 | Sambandamurthy et al. | |
| 2016/0291100 A1* | 10/2016 | Ha | G01R 33/34046 |
| 2016/0379744 A1 | 12/2016 | Vaesen | |
| 2018/0006352 A1* | 1/2018 | Issakov | G01R 33/365 |
| 2018/0074140 A1 | 3/2018 | Yang et al. | |

\* cited by examiner

COMPACT HYBRID ORTHOGONAL SIGNAL GENERATOR FOR MRI FRONT-END

CROSS-REFERENCE TO RELATED APPLICATIONS

The present application claims the benefit of the filing date of China patent application no. CN 202010679859.5, filed on Jul. 15, 2020, the contents of which are incorporated herein by reference in their entirety.

TECHNICAL FIELD

The disclosure relates to a magnetic resonance imaging system in the technical field of medical equipment and, in particular, to a magnetic resonance hybrid orthogonal signal generator, a coil transmission front-end device, and an RF coil system.

BACKGROUND

Magnetic resonance imaging (MRI) is an imaging technology involving biomagnetics and nuclear spin, which has advanced rapidly with the development of computer technology, electronic circuit technology, and superconductor technology. MRI uses a magnetic field and radio frequency (RF) pulses to induce oscillation of precessing hydrogen nuclei (i.e. H+) in human tissue to generate RF signals, which are processed by a computer to form an image. When an object is placed in the magnetic field and irradiated with suitable RF electromagnetic waves, the object generates a resonant frequency. By analyzing space-related information contained in the RF signal generating the resonant frequency, the positions and types of substances in the object can be reconstructed, and on this basis it is possible to draw a precise three-dimensional image of the interior of the object. For instance, an image of contiguous slices can be obtained by performing an MRI scan of the human brain.

An MRI system generally uses an RF body coil to apply an RF B1 field having the Larmor frequency to human tissue in a main magnetic field B0. It is necessary to provide an RF pulse signal with a phase difference of 90° as an orthogonal excitation signal for the RF body coil so that the spin axes of protons in the main magnetic field B0 experience deflection under the action of the B1 field. The size of an existing hybrid orthogonal signal generator placed in a front position with respect to the RF body coil and providing an orthogonal excitation signal for the RF body coil is restricted due to direct proportionality to the wavelength of the magnetic field strength, and due to the fact that the RF body coil is formed on the basis of branch-type lumped elements.

SUMMARY

In view of the above, one aspect of the present disclosure provides a hybrid orthogonal signal generator having a compact size and sufficient power capacity. The hybrid orthogonal signal generator has an input end for receiving an RF signal, generates a hybrid orthogonal excitation signal on the basis of the RF signal, and provides the hybrid orthogonal excitation signal by means of an output end of the hybrid orthogonal signal generator, and comprises: a first conductor, configured as an arc-shaped conductor pathway, the first conductor being connected between the input end and the output end; and a second conductor having mutual inductance with the first conductor, the second conductor being connected between the input end and output end, wherein the first conductor and second conductor are parallel and arranged as mirror images of each other.

Optionally, the hybrid orthogonal signal generator further comprises: a base board provided with two parallel faces as substrates; and a first terminal arranged on a first face of the base board, the first conductor being constructed on the first face of the base board, and the second conductor being constructed on a second face of the base board.

Optionally, in the hybrid orthogonal signal generator, a first terminal corresponding to the input end and a second terminal corresponding to the output end are constructed on the first face of the base board, and the first conductor led out from the first terminal in a convex arc shape is connected to the second terminal; and a third terminal corresponding to the input end and a fourth terminal corresponding to the output end are constructed on the second face of the base board, and the second conductor led out from the third terminal in a convex arc shape is connected to the fourth terminal; wherein the first terminal and the third terminal are defined as the input end of the hybrid orthogonal signal generator, and the second terminal and the fourth terminal are defined as the output end of the hybrid orthogonal signal generator.

Optionally, the base board of the hybrid orthogonal signal generator comprises a printed circuit board, the first conductor being constructed on a surface of the first face of the printed circuit board by etching, and the second conductor being constructed on a surface of the second face of the printed circuit board by etching.

Optionally, in the hybrid orthogonal signal generator, a value of mutual inductance between the first conductor and the second conductor is set by setting the lengths and curvatures of the first conductor and the second conductor.

Optionally, the first conductor of the hybrid orthogonal signal generator, led out from the input end and having a helical shape with at least one turn, is connected to the output end; and the second conductor, led out from the input end and having a helical shape with at least one turn, is connected to the output end, wherein the first conductor has at least one first self-intersection at which the first conductor is disconnected to form a first break, two ends of the first break being connected using a first bridging conductor, and the second conductor has at least one second self-intersection at which the second conductor is disconnected to form a second break, two ends of the second break being connected using a second bridging conductor.

Optionally, the first conductor of the hybrid orthogonal signal generator further comprises a first conductor first structural part with a break, the first conductor first structural part being connected between the input end and the output end, and at least one first conductor second structural part with a break is provided along a parallel position of a plane in which the first conductor first structural part lies; the second conductor further comprises a second conductor first structural part with a break, the second conductor first structural part being connected between the input end and the output end, and at least one second conductor second structural part with a break is provided along a parallel position of a plane in which the second conductor first structural part lies; when the first conductor first structural part and the first conductor second structural part are connected together so as to form the first conductor as a helical conductor pathway between the output end and the input end, the break of the first conductor first structural part is connected by means of a bridging conductor to a selected one break of the first conductor second structural part, and the second conductor first structural part is connected to the second conductor second structural part by means of a bridging conductor, so that the first conductor and the second conductor formed as helical conductor pathways between the output end and the input end are arranged as mirror images of each other.

Optionally, the first conductor and the second conductor of the hybrid orthogonal signal generator have mirror symmetry with respect to each other.

Optionally, in the hybrid orthogonal signal generator, a first capacitor is connected in a bridging fashion at the input end, and a second capacitor is connected in a bridging fashion at the output end.

Optionally, the input end and output end of the hybrid orthogonal signal generator are separately provided with filter circuits, which comprise grounded first resistors and grounded third capacitors.

Another aspect of the present disclosure discloses a coil transmission front-end device, comprising: the hybrid orthogonal signal generator as described above, the hybrid orthogonal signal generator being arranged between an RF transmission unit and an RF coil unit, wherein the input end of the hybrid orthogonal signal generator is connected to the RF transmission unit to receive the RF signal, and a hybrid orthogonal excitation signal is generated on the basis of the RF signal; the output end of the hybrid orthogonal signal generator is configured to provide the hybrid orthogonal excitation signal to an RF transmission coil of the RF coil unit.

Optionally, the coil transmission front-end device further comprises: a transmission/reception switch unit, configured to switch between a transmitting mode and a receiving mode, the transmitting mode corresponding to the RF transmission coil of the RF coil unit transmitting a first RF signal to a measurement object, and the receiving mode corresponding to an RF receiving coil of the RF coil unit receiving a second RF signal from the measurement object, wherein the output end of the hybrid orthogonal signal generator is connected to the transmission/reception switch unit, such that when the transmission/reception switch unit is set to the transmitting mode, the hybrid orthogonal signal generator provides the hybrid orthogonal excitation signal to the RF coil unit by means of the transmission/reception switch unit.

Another aspect of the present disclosure further discloses an RF coil system, comprising: an RF transmission unit for generating an RF signal; an RF coil unit, at least comprising an RF transmission coil, for transmitting a first RF signal to a measurement object; and the coil transmission front-end device as described above, an input end of the coil transmission front-end device being connected to the RF transmission unit to receive the RF signal, a hybrid orthogonal excitation signal being generated on the basis of the RF signal, and the hybrid orthogonal excitation signal being provided to the RF transmission coil.

Another aspect of the present disclosure provides an MRI system. The MRI system comprises the RF coil system as described above.

One advantage of the present disclosure is that the hybrid orthogonal signal generator according to the present disclosure has a more compact size, on account of being provided with two arc-shaped conductors having a high conduction constant with mutual inductance, to replace a hybrid orthogonal signal generator formed on the basis of branch-type lumped elements.

Another advantage is that by constructing the two conductors having mutual inductance as helical conductor pathways, the number of turns in the helical conductors is increased to suit application scenarios with lower field strengths while maintaining a compact size.

Another advantage is that the two conductors having mutual inductance are arranged as mirror images having mirror symmetry with respect to each other to fit a hybrid orthogonal excitation signal with a phase difference of 90.

Another advantage is that by configuring the conductors having mutual inductance to have a modular design, approximately helical conductor pathways having a certain number of turns are formed according to application scenarios with different field strengths.

BRIEF DESCRIPTION OF THE DRAWINGS/FIGURES

Embodiments of the present disclosure are described in detail below with reference to the accompanying drawings, to give those skilled in the art a clearer understanding of the abovementioned and other features and advantages of the present disclosure. Drawings.

Figure 1:
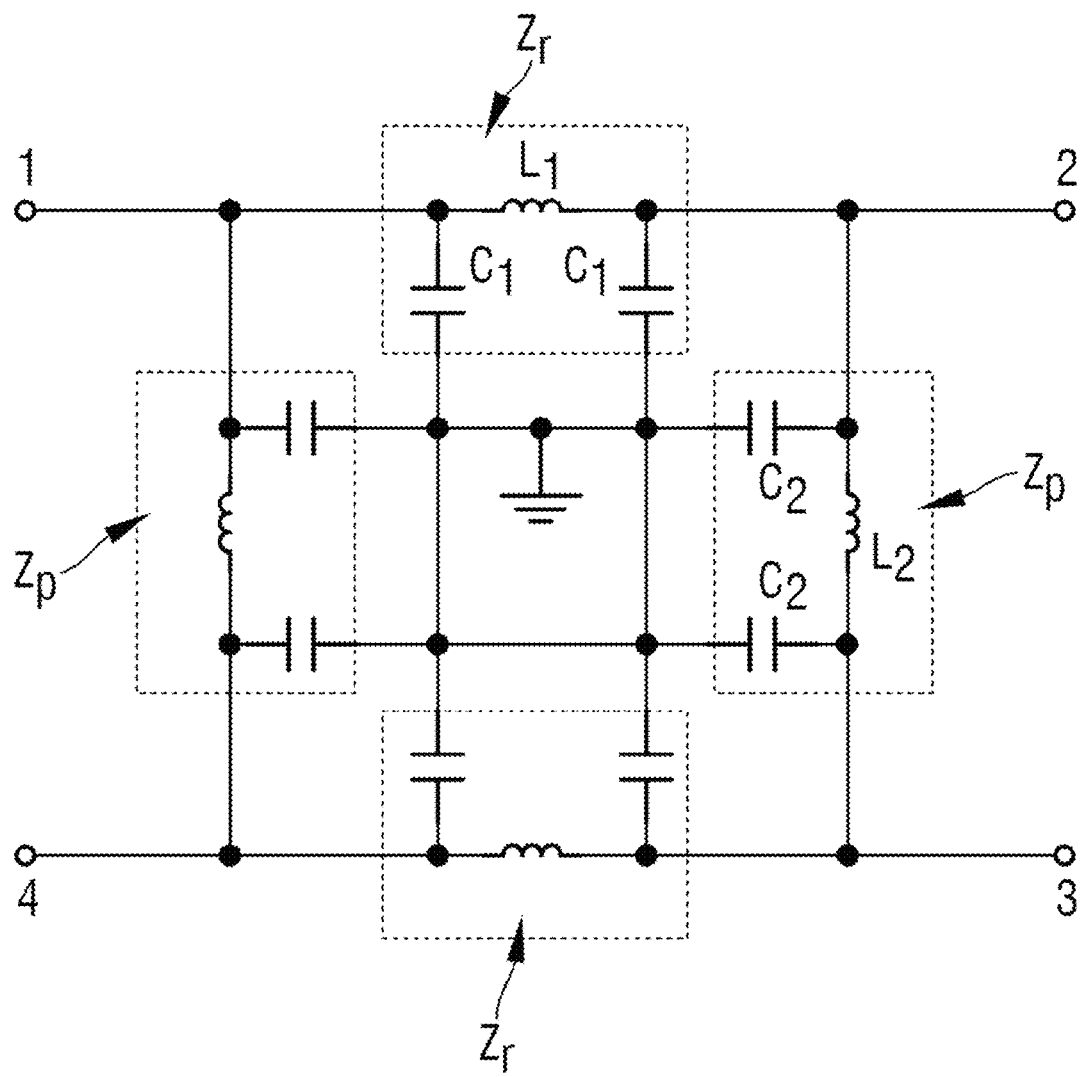
FIG. 1 is a schematic circuit diagram showing an example hybrid orthogonal signal generator based on lumped elements, according to one or more embodiments of the present disclosure.

Key to the drawings:
100 magnetic resonance imaging system
10 MR magnet assembly
12 magnet
14 gradient coil unit
16 RF coil unit
161 RF transmission coil
162 RF receiving coil
20 coil transmission front-end device
22 hybrid orthogonal signal generator
222a first conductor
222b second conductor 224a first bridging conductor
224b second bridging conductor
226a first conductor first structural part
226b second conductor first structural part
226c first conductor second structural part
226d second conductor second structural part
a-a' third break, fifth break b-b', c-c', d-d', e-e' fourth breaks, sixth breaks
24 transmission/reception switch unit
241 first transmission/reception switch
242 second transmission/reception switch
30 RF transmission unit
32 RF transmitter
34 false load
40 gradient amplifier
50 receiver
60 computer
70 pulse sequence generator
A first terminal
B second terminal
C third terminal
D fourth terminal
$C_1$ first capacitor $C_2$ first capacitor
$C_3$, $C_4$, $C_5$, $C_6$ third capacitors
$R_1$, $R_2$, $R_3$, $R_4$ first resistors

DETAILED DESCRIPTION

To enable a clearer understanding of the technical features, objectives, and effects of the disclosure, particular embodiments of the present disclosure are now explained with reference to the accompanying drawings, in which identical labels indicate identical parts.

As used herein, "schematic" means "serving as an instance, example or illustration". No drawing or embodiment described herein as "schematic" should be interpreted as being a more preferred or more advantageous technical solution.

To make the drawings appear uncluttered, only those parts relevant to the present disclosure are shown schematically in the drawings; they do not represent the actual structure thereof as a product. Furthermore, to make the drawings appear uncluttered for ease of understanding, in the case of components having the same structure or function in certain drawings, only one of these is drawn schematically, or only one is marked.

In this text, "a" does not only mean "just this one"; it may also mean "more than one". As used herein, "first" and "second" etc. are merely used to differentiate between parts, not to indicate their order or degree of importance, or any precondition of mutual existence, etc. FIG. 1 is a schematic circuit diagram showing an example hybrid orthogonal signal generator based on lumped elements, according to one or more embodiments of the present disclosure. As shown in FIG. 1, a π/2 hybrid orthogonal signal generator (Hybrid TX Front-end) in an MRI system can provide two RF pulse signals with a phase difference of 90° for a body coil, and thereby realize a constant $B_1$ field by providing an orthogonalized, polarized excitation signal for the body coil. Most existing MRI clinical applications are based on 3 T, 1.5 T or even lower fields, and the associated RF excitation frequencies are lower than 128 MHz. An existing hybrid orthogonal signal generator is of a branch-line type, and has a large size, generally larger than 200 mm×200 mm; this is because the size of a branch-line-type hybrid orthogonal signal generator formed on the basis of lumped elements (lumped components) is directly proportional to the wavelength of the Larmor frequency signal, and when the Larmor frequency is lower, the corresponding wavelength is longer, with the result that the existing hybrid orthogonal signal generator will have a larger size if the field strength is lower. As the RF excitation frequency increases, the volume of the π/2 hybrid orthogonal signal generator made on the basis of lumped elements will increase.

Generally, the hybrid orthogonal signal generator is comprised of lumped elements (e.g. lumped components). A lossless transmission line end in the form of a matrix can be represented by characteristic values of impedance Zr and electrical length θ. Lumped elements may include lumped inductive reactance elements, lumped capacitive reactance elements, and lumped impedance elements. At least 4 lumped inductive reactance elements need to be used for the framework of the hybrid orthogonal signal generator with the above structure, and due to the fact that the permitted residual value range of the lumped inductive reactance element is wider than that of the lumped capacitive reactance element, more effort is required in fine adjustment testing. Moreover, due to the fact that a high RF transmission current acts on the RF transmission end, the RF transmission end operating temperature increases, resulting in reduced reliability of mixing.

Figure 2:
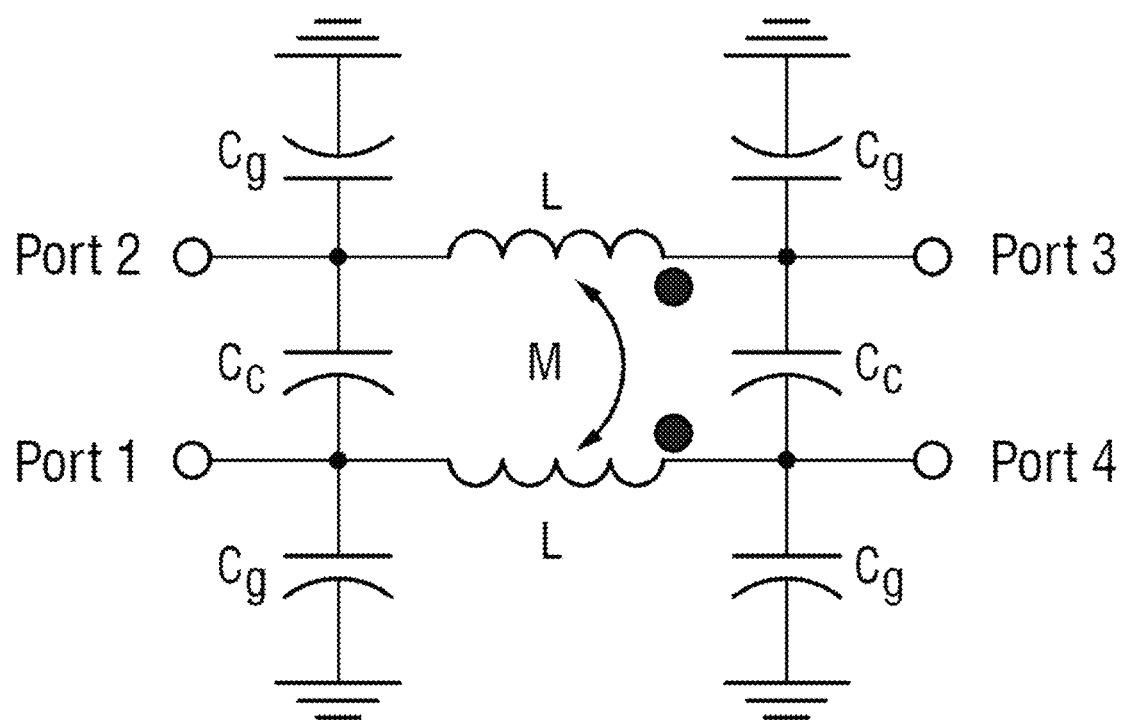
FIG. 2 is a schematic circuit diagram showing an example hybrid orthogonal signal generator based on lumped elements, according to one or more embodiments of the present disclosure.

In an attempt to reduce testing costs, as shown in FIG. 2, generally there is also another π/2 hybrid lumped element design shown, in which self-inductance and mutual-inductance lumped inductive reactance elements are used. However, constrained by size and power capacity restrictions, this framework is not advantageous in high energy transmission applications.

The present disclosure provides a hybrid orthogonal signal generator, which has an input end for receiving an RF signal, generates a hybrid orthogonal excitation signal on the basis of the RF signal, and provides the hybrid orthogonal excitation signal via an output end of the hybrid orthogonal signal generator, characterized in that the hybrid orthogonal signal generator comprises: a first conductor configured as a conductor pathway having an arc shape, the first conductor being connected between the input end and the output end; and a second conductor configured to have mutual inductance with the first conductor, the second conductor being connected between the input end and the output end, wherein the first conductor and second conductor are parallel and arranged as mirror images of each other. Thus, the hybrid orthogonal generator can have an input end connected to an RF transmission unit to receive the RF signal, generate a hybrid orthogonal excitation signal on the basis of the RF signal, and provide the hybrid orthogonal excitation signal to an RF coil unit, so as to apply to the $B_0$ main magnetic field a $B_1$ field orthogonal to $B_0$ and having the Larmor frequency to deflect the spins of protons in the $B_0$ main magnetic field by a certain angle. The hybrid orthogonal signal generator has a compact geometric size, and the basic concept thereof is that a mutual inductance device formed by arc-shaped or helical printed conductors is constructed on a substrate with a high conduction constant. Furthermore, to retain the application of the hybrid orthogonal signal generator in low-magnetic-field MRI systems, the number of turns of the helical printed conductor can be increased to obtain a high inductance coefficient.

A hybrid orthogonal signal generator according to the present disclosure is described in detail below in conjunction with the drawings.

Figure 3:
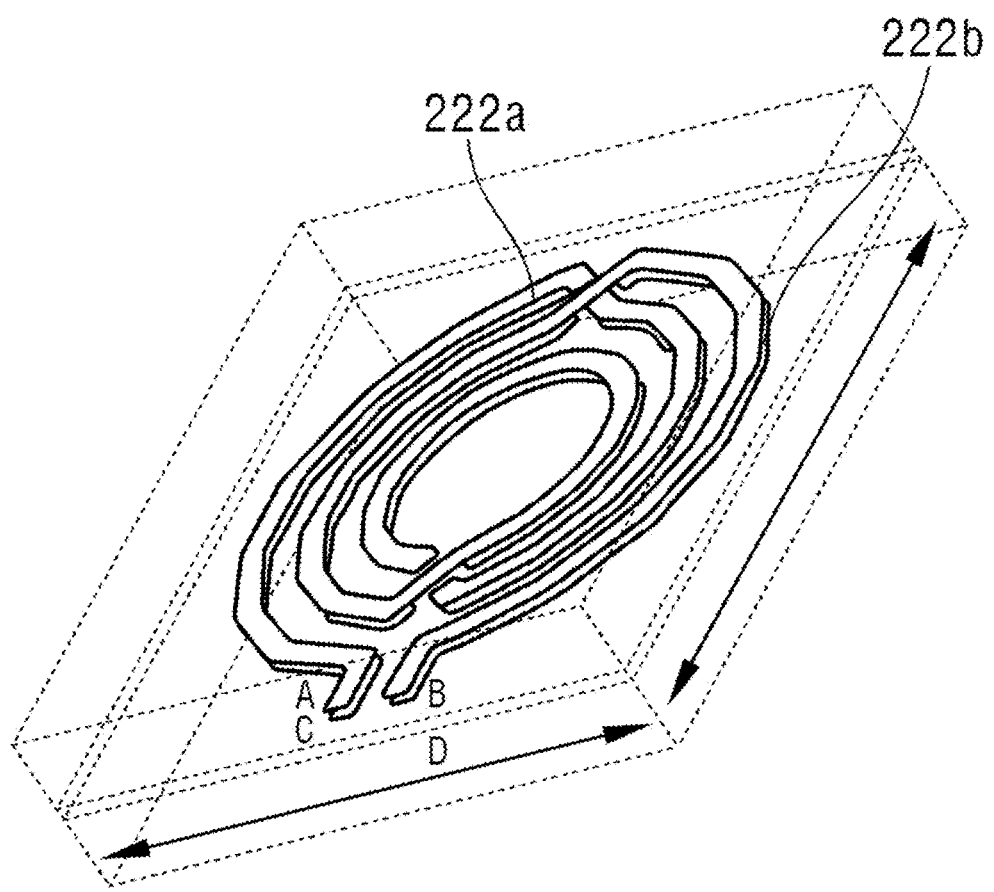
FIG. 3 is a three-dimensional simulation model diagram of example helical conductors with mutual inductance in a compact hybrid orthogonal signal generator, according to one or more embodiments of the present disclosure.

As shown in FIG. 3, a hybrid orthogonal signal generator 22 applied to a transmission front end of an RF coil unit can have a first conductor and a second conductor having mutual inductance constructed on two faces of a base board, the hybrid orthogonal signal generator comprising: the base board, provided with two parallel faces as substrates, the first conductor 222a being constructed on a first face of the base board, and the second conductor 222b being constructed on a second face of the base board.

According to some embodiments, a first terminal A corresponding to the input end and a second terminal B corresponding to the output end are constructed on the first face of the base board, and the first conductor 222a is led out from the first terminal A in a convex arc shape is connected to the second terminal B; a third terminal C corresponding to the input end and a fourth terminal D corresponding to the output end are constructed on the second face of the base board, and the second conductor 222b led out from the third terminal C in a convex arc shape is connected to the fourth terminal D; wherein the first terminal A and third terminal C are defined as the input end of the hybrid orthogonal signal generator 22, and the second terminal B and fourth terminal D are defined as the output end of the hybrid orthogonal signal generator 22.

According to one embodiment which is shown, the base board may be made from a material having a high conductivity constant. For this purpose, the base board comprises a printed circuit board (PCB), the first conductor 222a being constructed on a surface of the first face of the PCB, and the second conductor being constructed on a surface of the second face of the PCB. The first conductor 222a and second conductor 222b may be constructed on the surfaces of the two faces of the PCB separately by etching for example.

Specifically, according to one embodiment which is shown, a PCB of size 80 mm×80 mm is chosen, and the course of the conductor between the first terminal and second terminal can be constructed as the arc-shaped first conductor having a radius of $r_0$ on the first face of the PCB. On the second face of the PCB, the course of the conductor between the third terminal and fourth terminal can be constructed as the arc-shaped second conductor having a radius of $r_0$. The size of the PCB may be determined according to the field strength of the B1 field that is set; as the field strength of the $B_1$ field decreases, the size of the PCB will increase correspondingly.

It is explained that due to the fact that the RF signal generated by the RF transmission unit has the Larmor frequency, the frequency of the RF signal and the $B_1$ field applied to the main magnetic field by the RF body coil are in a linear relationship. Thus, when the magnetic field strength of the main magnetic field $B_0$ is lower, the strength of the $B_1$ field that needs to be applied is lower, because the frequency of the RF signal generated by the RF transmission unit is lower. According to some embodiments, to enable the hybrid orthogonal signal generator to adapt to different magnetic field strengths to provide the hybrid orthogonal excitation signal, the lengths and curvatures of the first conductor 222a and the second conductor 222b can be changed to set the mutual inductance value of the first conductor 222a and second conductor 222b. The Biot-Savart law can be used to design suitable lengths and curvatures of the first conductor and second conductor according to a known $B_1$ field strength. When it is necessary to set the first conductor 222a and second conductor 222b as arc-shaped, the curvature is set as $1/r_0$; thus, when the first conductor and second conductor are arc-shaped, it is only necessary to adjust the radius thereof.

Due to the restriction on the size of the PCB comprised by the base board, it is also possible to construct the first conductor 222a and/or second conductor 222b as a helical conductor, to adapt to a lower $B_1$ field strength by increasing the length of the first conductor 222a and/or second conductor 222b without changing the size of the PCB.

FIG. 3 is a three-dimensional simulation model diagram of example helical conductors with mutual inductance in a compact hybrid orthogonal signal generator, according to one or more embodiments of the present disclosure. As shown in FIG. 3, the hybrid orthogonal signal generator may comprise the first conductor 222a, which is led out from the output end, has a helical shape with at least one turn and is connected to the output end, and the second conductor 222b, which is led out from the output end, has a helical shape with at least one turn and is connected to the output end, wherein the first conductor 222a has at least one first self-intersection at which the first conductor 222a is disconnected to form a first break, the first break being connected using a first bridging conductor 224a, and the second conductor 222b has at least one second self-intersection at which the second conductor 222b is disconnected to form a second break, two ends of the second break being connected using a second bridging conductor 224b. Specifically, the hybrid orthogonal signal generator 22 may comprise the helical first conductor 222a, led out from the first terminal A and connected to the second terminal B, and the helical second conductor 222b, led out from the third terminal C and connected to the fourth terminal D. Furthermore, using the first bridging conductor 224a and the second bridging conductor 224b, the first terminal A can be connected to the second terminal B, and the third terminal C can be connected to the fourth terminal D such that the first conductor 222a and second conductor 222b form helical conductor pathways, avoiding short circuiting of the first conductor 222a and second conductor 222b at the first self-intersection and second self-intersection.

According to one embodiment which is shown, the first conductor 222a led out from the first terminal A converges helically toward the center to a first extremity, and the first conductor 222a is then led outward helically from the first extremity and connected to the second terminal B; and the second conductor 222b led out from the third terminal C converges helically toward the center to a second extremity, and the second conductor 222b is then led outward helically from the second extremity, and connected to the fourth terminal D.

According to one embodiment which is shown, for the embodiment shown in FIG. 3, in the case of a set $B_1$ field strength of 23 MHz, according to an electromagnetic simulation model, the helical first conductor 222a constructed between the first terminal A and second terminal B on one face of the PCB of size 80 mm×80 mm has two first self-intersections, and the two ends of each of the two first breaks are connected by means of two first bridging conductors 224a, thereby increasing the number of turns of the first conductor 222a forming the helical conductor pathway; similarly, the helical second conductor constructed between the third terminal C and fourth terminal D on the other face of the PCB has two second self-intersections, and the two ends of each of the two second breaks are connected by means of two second bridging conductors 224b to increase the number of turns of the helical conductor pathway of the second conductor 222b. The first conductor 222a and second conductor 222b may have mirror symmetry with respect to each other on the two faces of the PCB. According to some embodiments, based on the input $B_1$ field strength, PCB size information, and a geometric restriction setting the first conductor 222a and second conductor 222b to be arc-shaped, the electromagnetic simulation model can set the curvature to be the reciprocal of radius, and then use an iterative procedure based on the Biot-Savart law to generate the arc-shaped or helical conductor pathway shapes of the first conductor 222a and second conductor 222b forming the hybrid orthogonal signal generator 22.

Figure 5:
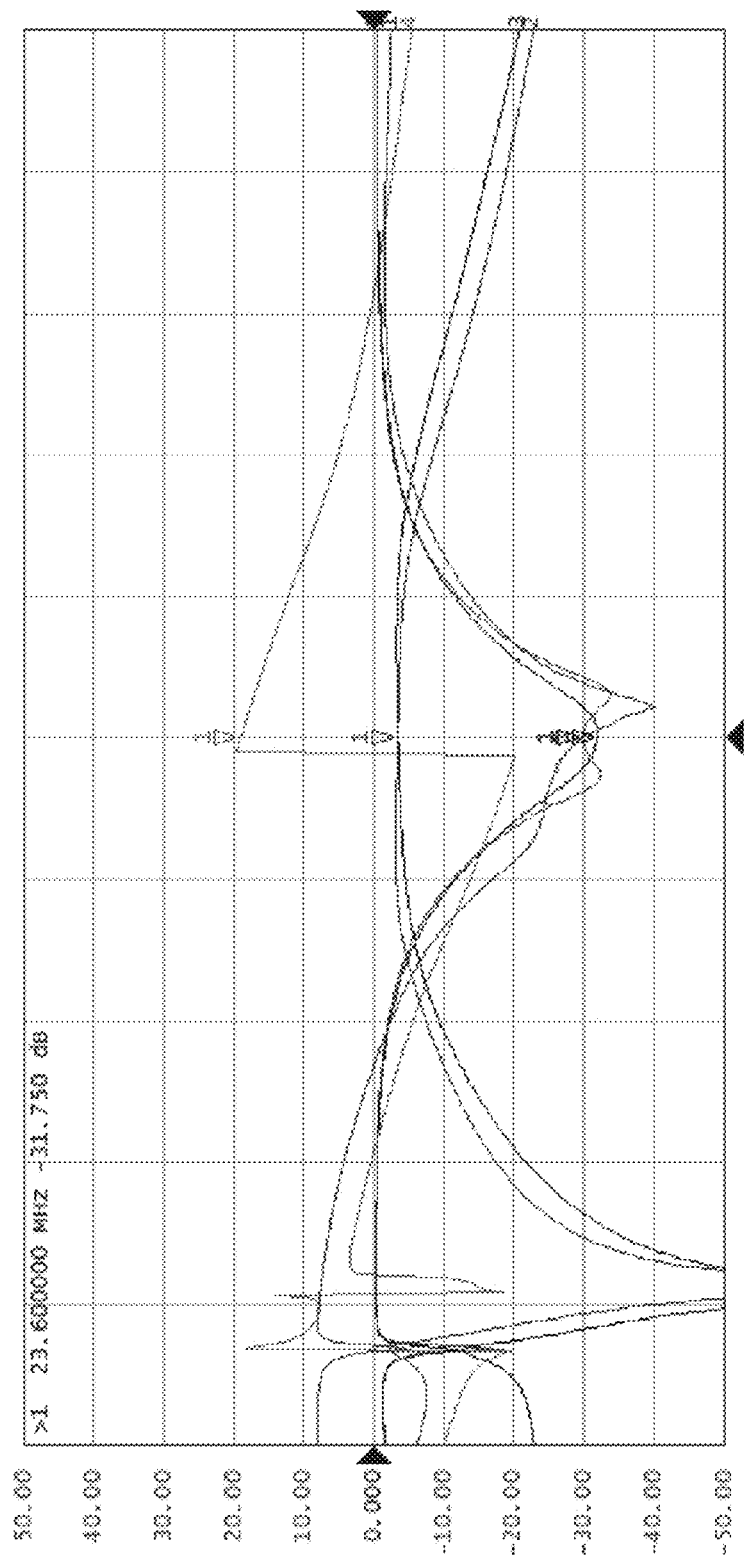
FIG. 5 shows example simulation electromagnetic signal measurement results for a hybrid orthogonal signal generator in a low-magnetic-field application, according to one or more embodiments of the present disclosure.

In addition, as shown in FIG. 5, the electromagnetic simulation model can also measure the phase difference of hybrid orthogonal excitation signals generated by the generated hybrid orthogonal signal generator 22, e.g. in the embodiment above, in the case where $B_1$=23 MHz, for the hybrid orthogonal signal generator in which the size of the PCB is 80 mm×80 mm, and the helical conductor pathways of the first conductor 222a and second conductor 222b have 2 turns, the phase difference of hybrid orthogonal excitation signals generated thereby is measured to be $\Delta_{phase}$=89.76.

According to some embodiments, in order that the phase difference of hybrid orthogonal excitation signals generated by the hybrid orthogonal signal generator 22 is as close as possible to 90, the first conductor 222a and second conductor 222b may have mirror symmetry with respect to each other. According to one embodiment which is shown, the first conductor 222a and second conductor 222b may have mirror symmetry on two parallel faces of the base board or PCB.

To enable simultaneous application of the hybrid orthogonal signal generator 22 in application scenarios with different B1 field strengths, the hybrid orthogonal signal generator 22 constructed on a base body or PCB of the same size may have a modular design, to suit application in different magnetic resonance system field strength situations.

Figure 6:
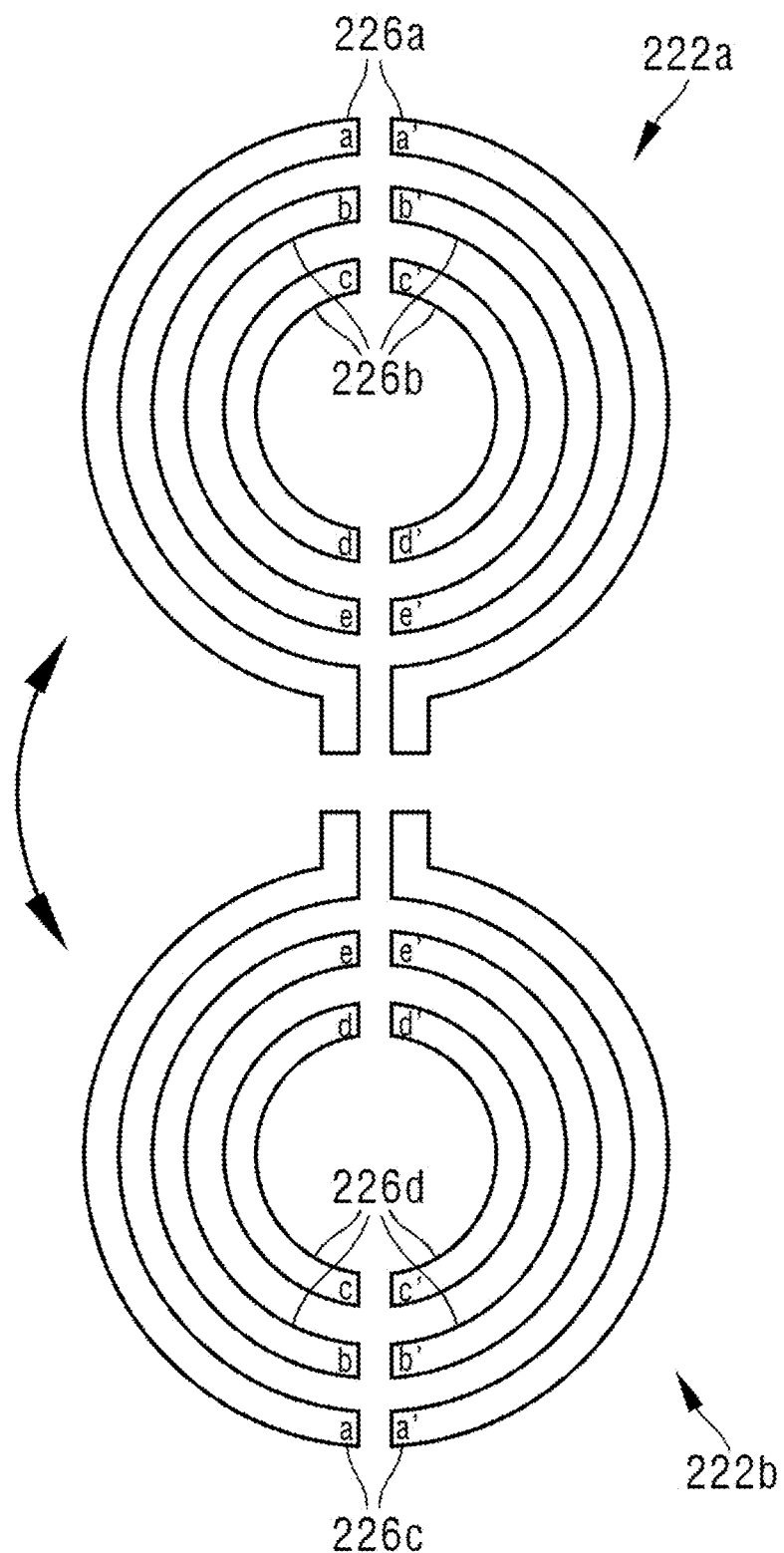
FIG. 6 is a schematic model diagram showing an example hybrid orthogonal signal generator with a modular design, according to one or more embodiments of the present disclosure.

FIG. 6 is a schematic model diagram showing an example hybrid orthogonal signal generator with a modular design, according to one or more embodiments of the present disclosure. According to some embodiments, as shown in FIG. 6, a hybrid orthogonal signal generator 22 based on a modular design comprises the following: the first conductor 222a further comprises a first conductor first structural part 226a with a break a-a', the first conductor first structural part 226a being connected between the input end and output end, and at least one first conductor second structural part 226b with a break b-b', c-c', d-d' is provided along a parallel position of a plane in which the first conductor first structural part 222a lies; the second conductor 222b further comprises a second conductor first structural part 226c with a break a-a', the second conductor first structural part 226c being connected between the input end and output end, and at least one second conductor second structural part 226d with a break b-b', c-c', d-d' is provided along a parallel position of a plane in which the second conductor first structural part 226c lies; when the first conductor first structural part 226a and first conductor second structural part 226b are connected together so as to form the first conductor 222a as a helical conductor pathway between the output end and input end, the break a-a' of the first conductor first structural part 226a is connected by means of bridging conductors to a selected one break b-b', c-c', d-d' of the first conductor second structural part 226b, and the second conductor first structural part 226c is connected to the second conductor second structural part 226d by means of bridging conductors, so that the first conductor 222a and the second conductor 222b formed as helical conductor pathways between the output end and input end are arranged as mirror images of each other.

Specifically, the hybrid orthogonal signal generator 22 comprises the following: the first conductor 222a comprises a first conductor first structural part 226a with a break, and at least one first conductor second structural part 226b is provided at a parallel position of the plane in which the first conductor first structural part 226a lies, the first conductor first structural part 226a is provided with a third break a-a' between the input end and output end, and the first conductor second structural part 226b is provided with at least one fourth break b-b', c-c', d-d', e-e', and when the first conductor first structural part 226a is connected to the first conductor second structural part 226b, the third break a-a' is connected by means of a pair of diagonal third bridging conductors to a selected one fourth break b-b', c-c', d-d', e-e' so as to form the first conductor 222a as a helical conductor pathway; the second conductor 222b comprises a second conductor first structural part 226c with a break, and at least one second conductor second structural part 226d with a break is provided at a parallel position of the plane in which the second conductor first structural part 226c lies, the second conductor first structural part 226c is provided with a fifth break a-a' between the input end and output end, and the second conductor second structural part 226d is provided with at least one sixth break b-b', c-c', d-d', e-e', and when the second conductor 222b is connected to the second parallel conductor 226b, the fifth break a-a' can be connected by means of a pair of diagonal fourth bridging conductors to a selected one sixth break b-b', c-c', d-d', e-e'. With the manner of construction described above, the first conductor first structural part 226a is connected at the third break a-a' via the third bridging conductors to a selected one fourth break b-b', c-c', d-d', e-e' of the first conductor second structural part 226b, and the second conductor first structural part 226c is connected at the fifth break a-a' via the fourth bridging conductors to a selected one sixth break b-b', c-c', d-d', e-e' of the second conductor second structural part 226d; the first conductor 222a and second conductor 222b can be similarly constructed as helical conductor pathways on the two faces of the base board or PCB respectively, so as to form mutual inductance between the first conductor 222a and second conductor 222b between the input end and output end of the hybrid orthogonal signal generator.

According to one embodiment which is shown, as FIG. 6 shows, on a first side of the base board/PCB, the first conductor first structural part 226a connecting the first terminal A to the second terminal B is constructed as a conductor pathway having an arc shape, and the first conductor has radius $r_1$; and at the same time, two first conductor second structural parts 226b, arranged at a certain spacing and parallel to the first conductor first structural part 226a, have radii $r_2$, $r_3$, wherein the radii $r_2$, $r_3$ are each less than $r_1$. At the same time, on a second face of the base board/PCB, the second conductor first structural part 226c connecting the third terminal C to the fourth terminal D, and two second conductor second structural parts 226d arranged at a certain spacing and parallel to the second conductor first structural part 226c, are arranged as mirror images of the first conductor first structural part 226a and first conductor second structural parts 226b on the first face respectively. The third break and fifth break of the first conductor first structural part 226a and second conductor first structural part 226b are labelled a-a'; the fourth breaks can be separately provided in the two first conductor second structural parts 226b at opposite positions to the third break a-a' provided in the first conductor first structural part 226a, and are labelled b-b', c-c', d-d' and e-e'; and the sixth breaks can be separately provided in the two mirror-image second conductor second structural parts 226d at opposite positions to the fifth break a-a' provided in the second conductor first structural part 226c, and are labelled b-b', c-c', d-d' and e-e'. Additionally, the base board/PCB may have a size of 80 mm×80 mm.

Specific modular design applications of the hybrid orthogonal signal generator 22 may include the following scenarios: when the $B_1$ field strength is set at 3 T, it is only necessary to connect the a-a' breaks of the first conductor first structural part 226a and second conductor first structural part 226c using bridging conductors, thereby separately forming the first conductor 222a and second conductor 222b in the embodiment as described above.

When the $B_1$ field strength is set at 1.5 T, a pair of diagonal third bridging conductors may be used to connect the break d-a' and the break d'-a between the first conductor first structural part 226a and the second first conductor second structural part 226b, and connect the other break c-c' in the first conductor second structural part 226b by means of another bridging conductor, thereby forming a first conductor 222a having a helical conductor pathway with 1 turn; similarly, a pair of diagonal fourth bridging conductors may be used to connect the break d-a' and the break d'-a between the second conductor first structural part 226c and the second of the second conductor second structural parts 226d, and the break c-c' in the second conductor second structural part 226d is connected by means of another bridging conductor, thereby forming a second conductor 222b which is arranged as a mirror image of the first conductor 222a and can have mutual inductance with the first conductor 222a.

For cases where the $B_1$ field strength is set even lower, e.g. when $B_1$=23 MHz, a-b', b-a', d-e', e'-d and c-c' may be sequentially connected by means of bridging conductors on the two faces of the base board/PCB, to obtain a pair of mutually inductive conductors having helical conductor pathways similar to 2 turns.

In order to achieve fine adjustment of the capacitance of the hybrid orthogonal signal generator 22, without changing the overall size of the hybrid orthogonal signal generator 22, a capacitor device with a small volume and a small capacitance can be connected between the output ends and between the input ends of the hybrid orthogonal signal generator 22 to perform fine adjustment of capacitance.

Figure 4:
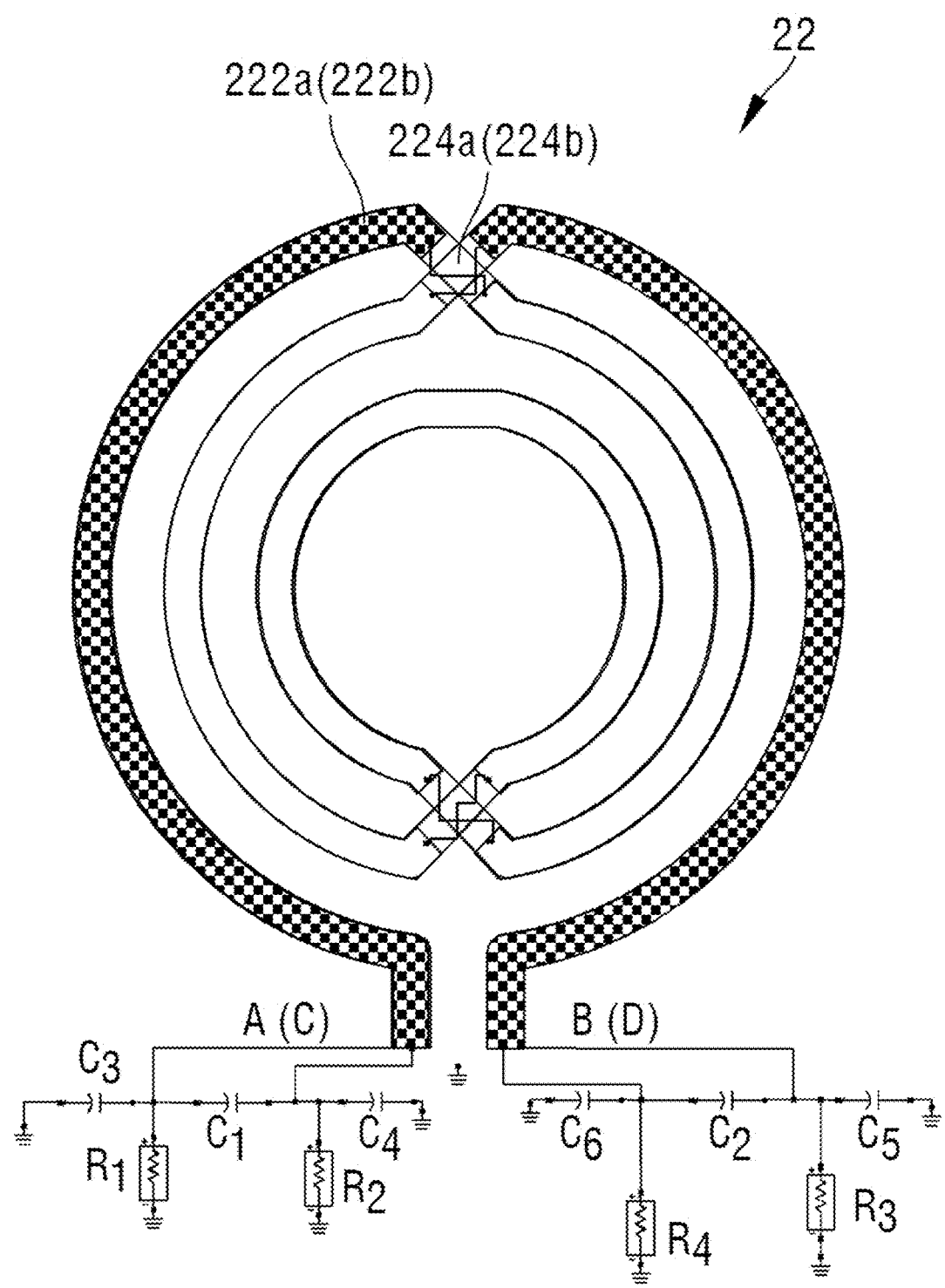
FIG. 4 is a circuit diagram showing an example hybrid orthogonal signal generator, according to one or more embodiments of the present disclosure.

FIG. 4 is a circuit diagram showing an example hybrid orthogonal signal generator, according to one or more embodiments of the present disclosure. As shown in FIG. 4, a first capacitor $C_1$ is connected in a bridging fashion at the input ends of the hybrid orthogonal signal generator 22, and a second capacitor $C_2$ is connected in a bridging fashion at the output ends; the capacitances and volumes of the first capacitor $C_1$ and second capacitor $C_2$ are small (e.g. a proportion of the other capacitances such as $1/10^{th}$, $1/100^{th}$, etc.) for fine adjustment of the capacitance of the hybrid orthogonal signal generator. In addition, to understand the significance and positions of the first capacitor $C_1$ and second capacitor $C_2$, an associated circuit in FIG. 2 based on a branched hybrid orthogonal generator can be referred to; this circuit can be considered to be an equivalent circuit of the hybrid orthogonal signal generator 22 according to the present disclosure.

According to one embodiment which is shown, as FIG. 4 shows, a first capacitor is provided between the first terminal A and third terminal C of the input end, and a second capacitor is provided between the second terminal B and fourth terminal D of the output end.

In order to reduce the effect of noise or interference on the hybrid orthogonal signal generator 22, a filter circuit can be provided for the hybrid orthogonal signal generator 22.

According to some embodiments, as shown in FIG. 4, the input end and output end of the hybrid orthogonal signal generator 22 are separately provided with filter circuits, which comprise grounded first resistors $R_1$, $R_2$, $R_3$, $R_4$ and grounded third capacitors $C_3$, $C_4$, $C_5$, $C_6$. Each filter circuit separately forms an RC filter circuit from the first resistor $R_1$ and the third capacitor $C_3$, the first resistor $R_1$ and the third capacitor $C_3$, the first resistor $R_1$ and the third capacitor $C_3$, the first resistor $R_1$ and the third capacitor $C_3$, etc. According to one embodiment which is shown, as FIG. 4 shows, input ends of the filter circuits of the hybrid orthogonal signal generator 22 may comprise the first terminal A and third terminal C, and output ends may comprise the second terminal B and fourth terminal D, such that the first terminal A, third terminal C, second terminal B and fourth terminal D can be sequentially connected to the first resistors $R_1$, $R_2$, $R_3$, $R_4$ respectively and grounded, and sequentially connected to the third capacitors $C_3$, $C_4$, $C_5$, $C_6$ respectively and grounded. Similarly, the resistances and capacitances of the abovementioned electronic components are small, and will not affect the volume of the hybrid orthogonal signal generator 22.

Another aspect of the present disclosure provides a coil transmission front-end device, which can provide a hybrid orthogonal excitation signal for an RF transmission coil in an RF coil unit.

Figure 7:
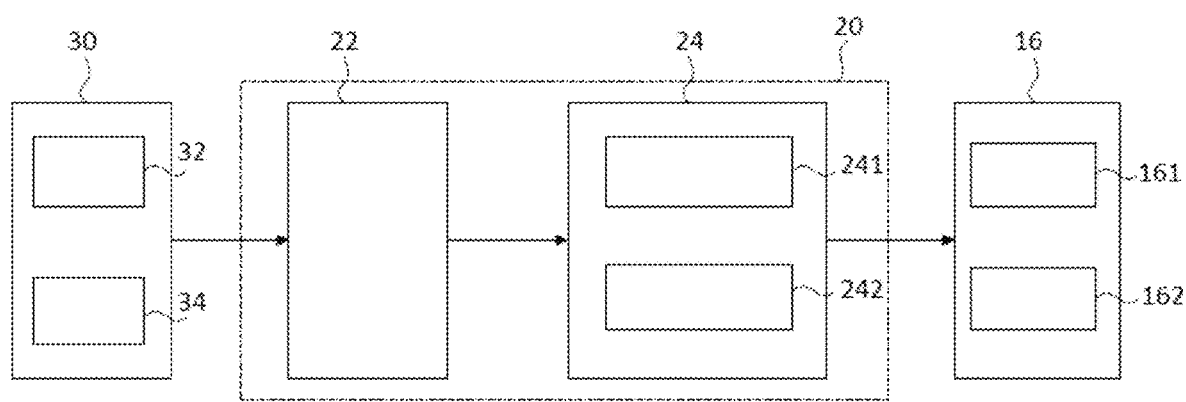
FIG. 7 is a functional block diagram showing an example RF coil system, according to a one or more embodiments of the present disclosure.

FIG. 7 is a functional block diagram showing an example RF coil system, according to a one or more embodiments of the present disclosure. As shown in FIG. 7, the coil transmission front-end device 20 comprises: a hybrid orthogonal signal generator 22, the hybrid orthogonal signal generator 22 being arranged between an RF transmission unit 30 and an RF coil unit 16, wherein an input end of the hybrid orthogonal signal generator 22 is connected to the RF transmission unit 30 (e.g. an RF transmission system or RF transmission circuitry) to receive an RF signal, and generates a hybrid orthogonal excitation signal on the basis of the RF signal, and an output end of the hybrid orthogonal signal generator 22 is configured to provide the hybrid orthogonal excitation signal to an RF transmission coil 161 of the RF coil unit 16.

The RF coil unit 16 may comprise the RF transmission coil 161 configured to transmit a first RF signal to a measurement object or imaging object in the MRI system, and an RF receiving coil 162 configured to receive a second RF signal as a response from the measurement object or imaging object. The RF transmission coil 161 can transmit the first RF signal to the measurement object or imaging object under the action of the hybrid orthogonal excitation signal, and the second RF signal is an RF resonance signal from the measurement object or imaging object, being precession with respect to the spin axis that is experienced by associated spinning nucleons in the measurement object or imaging object due to excitation under the action of an RF resonant frequency, and having substance information relating to spatial distribution.

According to some embodiments, the RF transmission unit 30 may comprise an RF transmitter 32 configured to generate an RF signal having the Larmor frequency, the RF signal being received by the hybrid orthogonal signal generator 22 to generate the hybrid orthogonal excitation signal for exciting the RF transmission coil 161, and a false load 34 (e.g. a dummy load) for regulating the RF transmitter 32; the RF transmitter 32 can be connected to the first terminal A or third terminal C of the input end, and the false load 34 can be connected to the other terminal. The RF transmitter 32 can be connected to an RF amplifier to amplify a pulse sequence generated by a pulse sequence generator of the MRI system.

According to some embodiments, the coil transmission front-end device 20 may further comprise: a transmission/reception switch unit 24 (e.g. switching circuitry) configured to switch between a transmitting mode and a receiving mode, the transmitting mode corresponding to the RF transmission coil 161 transmitting the first RF signal to a measurement object, and the receiving mode corresponding to the RF receiving coil 162 of the RF coil unit 16 receiving the second RF signal from the measurement object, wherein the output end of the hybrid orthogonal signal generator 22 is connected to the transmission/reception switch unit 24, such that when the transmission/reception switch unit 24 is set to the transmitting mode, the hybrid orthogonal signal generator 22 provides the hybrid orthogonal excitation signal to the RF transmission coil 161 by means of the transmission/reception switch unit 24.

According to some embodiments, the second terminal B and fourth terminal D of the output end of the hybrid orthogonal signal generator 22 may be connected to the transmission/reception switch unit 24.

According to some embodiments, the transmission/reception switch unit 24 comprises: a first transmission/reception switch 241 corresponding to 0 phase, and a second transmission/reception switch 242 corresponding to 90° phase; the first transmission/reception switch 241 can be connected to the second terminal B of the output end of the hybrid orthogonal signal generator 22, and the second transmission/reception switch 242 can be connected to the fourth terminal D; when the first transmission/reception switch 241 and second transmission/reception switch 242 are set to the transmitting mode, the hybrid orthogonal signal generator 22 can provide the hybrid orthogonal excitation signal to the RF transmission coil 161, in order to excite the RF transmission coil 161 to transmit the first RF signal with the Larmor frequency to a measurement/imaging object. Furthermore, the RF receiving coil 16 can also be connected to the transmission/reception switch unit 24; the second RF signal reflecting the resonance signal of the measurement/imaging object is received by means of the transmission/reception switch unit 24 set to the receiving mode, and sent via a reception path to a receiver of the MRI system for reception; the receiver can send the resonance signal to a reconstruction device/unit to obtain an image.

Another aspect of the present disclosure discloses an RF coil system, which may comprise: an RF transmission unit 30 configured to generate an RF signal, an RF coil unit 16 which at least comprises an RF transmission coil 161 configured to transmit a first RF signal to a measurement object, and a coil transmission front-end device 20, an input end of the coil transmission front-end device 20 being connected to the RF transmission unit 30 to receive the RF signal; a hybrid orthogonal excitation signal is generated on the basis of the RF signal, and the hybrid orthogonal excitation signal is provided to the RF transmission coil 161.

Another aspect of the present disclosure discloses an MRI system, the MRI system 100: the RF coil system as described above.

Figure 8:
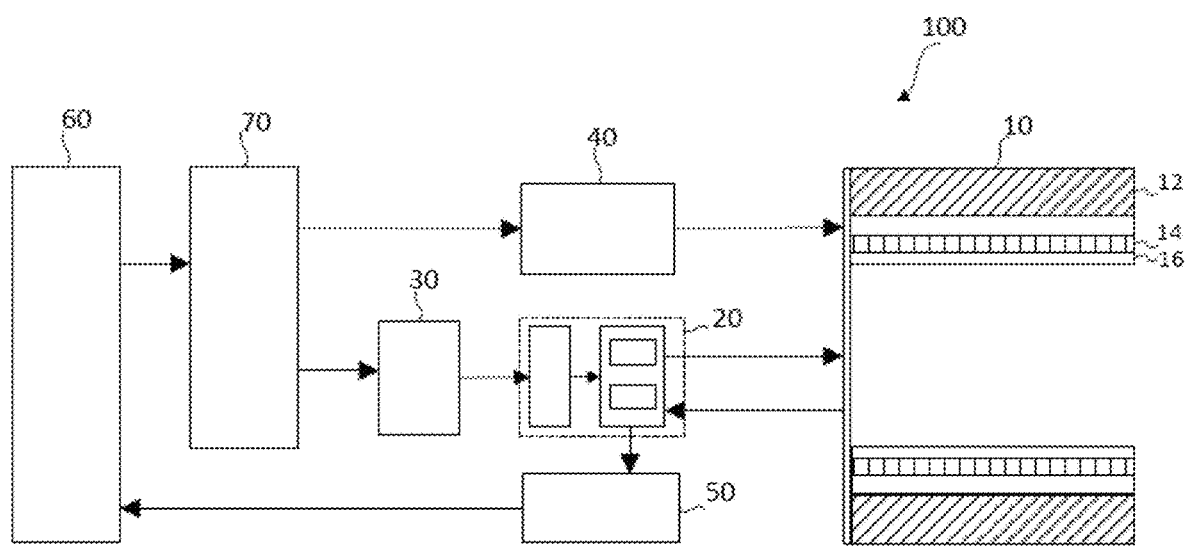
FIG. 8 is a functional block diagram showing an example MRI system, according to one or more embodiments of the present disclosure.

FIG. 8 is a functional block diagram showing an example MRI system, according to one or more embodiments of the present disclosure. As shown in FIG. 8, in the MRI system 100, an MR magnet assembly 10 may comprise: a space part (e.g. a magnetic resonance cavity) to place an object or patient in, wherein the space part may surround the object or patient to perform imaging; a magnet 12 for forming a static magnetic field $B_0$; a gradient coil unit 14 configured to be connected to a gradient amplifier 40, wherein the gradient amplifier 40 is used to provide excitation for the gradient coil unit 14, such that the gradient coil unit 14 provides a gradient magnetic field to the space part; an RF coil unit 16 (e.g. RF coil circuitry), the RF coil unit 16 comprising an RF transmission coil 161 configured to provide an RF pulse signal to excite spinning nucleons in the object to precess about a spin axis at a resonant RF frequency (or the Larmor frequency), and an RF receiving coil 162 configured to detect a magnetic resonance signal generated by the object. The RF transmission unit 30 is configured to generate an RF signal for providing excitation for the RF transmission coil 161; the RF signal may be generated by a pulse sequence generated by a pulse sequence generator 70. The pulse sequence generator 70 may also receive an instruction from a computer 60 to provide the pulse sequence to the gradient coil unit 14, and the gradient coil unit 14 generates a gradient magnetic field in order to read spatial information. The RF transmission unit 30 may comprise the RF transmitter 32; the RF transmitter 32 may comprise an RF amplifier configured to amplify the pulse sequence and then generate the RF signal for exciting the RF transmission coil 161. The coil transmission front-end device 20 is configured to receive the RF signal from the RF transmission unit 30, and comprises the hybrid orthogonal signal generator 22 for generating, based on the RF signal, a hybrid orthogonal excitation signal for exciting the RF transmission coil 161, and provides the hybrid orthogonal excitation signal to the RF transmission coil 161 by means of the transmission/reception switch unit 24.

A receiver 50 may be arranged in a reception path of the MRI system 100, and is configured to receive from the RF receiving coil 162 by means of the transmission/reception switch unit 24 (e.g. switching circuitry), a resonance signal generated at the Larmor frequency by spinning nucleons of the object. The receiver 50 may comprise a front-positioned amplifier, which can amplify the resonance signal and then provide it to a reconstruction unit/device of the computer 60. The reconstruction unit/device can use an inverse Fourier transform operation to reconstruct, from the resonance signal, a spatial distribution image reflecting the substance of the measurement object. The receiver 50 may further comprise an analog-to-digital conversion unit (e.g. ADC circuitry), to provide a digital signal for the computer 60.

The above are exemplary embodiments of the present disclosure, which are not intended to limit it. Any amendments, equivalent substitutions or improvements, etc. made within the spirit and principles of the present disclosure shall be included in the scope of protection thereof.

What is claimed is:

1. A hybrid orthogonal signal generator, comprising:
    an input end configured to receive an RF signal, generate a hybrid orthogonal excitation signal on the basis of the RF signal, and provide the hybrid orthogonal excitation signal to an output end of the hybrid orthogonal signal generator;
    a first conductor configured as an arc-shaped conductor pathway, the first conductor being connected between the input end and to the output end; and
    a second conductor configured to have mutual inductance with the first conductor, the second conductor being connected between the input end and the output end,
    wherein the first conductor and second conductor are parallel and symmetric.

2. The hybrid orthogonal signal generator as claimed in claim 1, further comprising: a substrate having a first side and a second side,
    wherein the first conductor is disposed on the first side of the substrate, and
    wherein the second conductor is disposed on the second side of the substrate.

3. The hybrid orthogonal signal generator as claimed in claim 2, further comprising:
    a first terminal corresponding to the input end and a second terminal corresponding to the output end disposed on the first side of the substrate, the first conductor having a convex arc shape and being connected between the first terminal and the second terminal; and a third terminal corresponding to the input end and a fourth terminal corresponding to the output end disposed on the second side of the substrate, the second conductor having a convex arc shape and being connected between the third terminal and the fourth terminal, wherein the first terminal and the third terminal are associated with the input end of the hybrid orthogonal signal generator, and wherein the second terminal and the fourth terminal are associated with the output end of the hybrid orthogonal signal generator.

4. The hybrid orthogonal signal generator as claimed in claim 2, wherein:
the substrate comprises a printed circuit board,
the first conductor is disposed on a surface of the first side of the printed circuit board via etching, and
the second conductor is disposed on the second side of the printed circuit board via etching.

5. The hybrid orthogonal signal generator as claimed in claim 1, wherein a value of mutual inductance between the first conductor and the second conductor is set by setting lengths and curvatures of the first conductor and the second conductor.

6. The hybrid orthogonal signal generator as claimed in claim 1, wherein:
the first conductor (i) has a helical shape with at least one turn and is connected to the output end, and (ii) has at least one first self-intersection at which the first conductor is disconnected to form a first break, two ends of the first break being connected using a first bridging conductor,
the second conductor (i) has a helical shape with at least one turn and is connected to the output end, and (ii) has at least one second self-intersection at which the second conductor is disconnected to form a second break, two ends of the second break being connected using a second bridging conductor.

7. The hybrid orthogonal signal generator as claimed in claim 1, wherein:
the first conductor further comprises a first conductor first structural part with a break, and at least one first conductor second structural part with a break is provided along a parallel position of a plane in which the first conductor first structural part lies,
the second conductor further comprises a second conductor first structural part with a break, the second conductor first structural part being connected between the input end and the output end, and at least one second conductor second structural part with a break is provided along a parallel position of a plane in which the second conductor first structural part lies,
the first conductor first structural part and the first conductor second structural part are connected together so as to form the first conductor as a helical conductor pathway between the output end and the input end such that the break of the first conductor first structural part is connected via a bridging conductor to a break of the first conductor second structural part, and
the second conductor first structural part is connected to the second conductor second structural part via a bridging conductor such that the first conductor and the second conductor formed as helical conductor pathways between the output end and the input end are arranged symmetrically.

8. The hybrid orthogonal signal generator as claimed in claim 1, wherein a first capacitor is connected in a bridging fashion at the input end, and
wherein a second capacitor is connected in a bridging fashion at the output end.

9. The hybrid orthogonal signal generator as claimed in claim 1, wherein the input end and the output end are separately provided with filter circuits, which comprise grounded resistors and grounded capacitors.

10. The hybrid orthogonal signal generator as claimed in claim 1, wherein:
the hybrid orthogonal signal generator is arranged between an RF transmission circuitry and an RF coil circuitry,
the input end of the hybrid orthogonal signal generator is connected to the RF transmission circuitry and configured to receive the RF signal,
a hybrid orthogonal excitation signal is generated on the basis of the RF signal, and
the output end of the hybrid orthogonal signal generator is configured to provide the hybrid orthogonal excitation signal to an RF transmission coil of the RF coil circuitry.

11. An RF coil system, comprising:
RF transmission circuitry configured to generate an RF signal;
RF coil circuitry comprising an RF transmission coil configured to transmit a first RF signal to a measurement object; and
a coil transmission front-end device including a hybrid orthogonal signal generator, comprising:
an input end configured to receive an RF signal, generate a hybrid orthogonal excitation signal on the basis of the RF signal, and provide the hybrid orthogonal excitation signal to an output end of the hybrid orthogonal signal generator;
a first conductor configured as an arc-shaped conductor pathway, the first conductor being connected between the input end and to the output end; and
a second conductor configured to have mutual inductance with the first conductor, the second conductor being connected between the input end and the output end,
wherein the first conductor and second conductor are parallel and symmetric, and
wherein an input end of the coil transmission front-end device is connected to the RF transmission circuitry to receive the RF signal, a hybrid orthogonal excitation signal being generated on the basis of the RF signal, and the hybrid orthogonal excitation signal being provided to the RF transmission coil.

12. The RF coil system as claimed in claim 11, further comprising:
transmission/reception switching circuitry configured to switch between a transmitting mode and a receiving mode,
wherein the transmitting mode corresponds to the RF transmission coil transmitting a first RF signal to the measurement object, and the receiving mode corresponds to an RF receiving coil of the RF coil circuitry receiving a second RF signal from the measurement object, and
wherein the output end of the hybrid orthogonal signal generator is connected to the transmission/reception switching circuitry such that, when the transmission/reception switching circuitry is set to the transmitting mode, the hybrid orthogonal signal generator provides the hybrid orthogonal excitation signal to the RF transmission coil via the transmission/reception switching circuitry.

13. An magnetic resonance imaging (MRI) system, comprising:
- a MR magnet assembly including a magnetic resonance cavity configured to receive a measurement object to perform imaging thereon; and
- a coil transmission front-end device including a hybrid orthogonal signal generator, comprising:
  - an input end configured to receive an RF signal, generate a hybrid orthogonal excitation signal on the basis of the RF signal, and provide the hybrid orthogonal excitation signal to an output end of the hybrid orthogonal signal generator;
  - a first conductor configured as an arc-shaped conductor pathway, the first conductor being connected between the input end and to the output end; and
  - a second conductor configured to have mutual inductance with the first conductor, the second conductor being connected between the input end and the output end,
  - wherein the first conductor and second conductor are parallel and symmetric, and
  - wherein an input end of the coil transmission front-end device is connected to RF transmission circuitry configured to receive the RF signal, a hybrid orthogonal excitation signal being generated on the basis of the RF signal, and the hybrid orthogonal excitation signal being provided to an RF transmission coil; and
- transmission/reception switching circuitry configured to switch between a transmitting mode and a receiving mode, the transmitting mode corresponding to the RF transmission coil transmitting a first RF signal to the measurement object, and the receiving mode corresponding to an RF receiving coil receiving a second RF signal from the measurement object.

* * * * *